United States Patent
Verma et al.

(10) Patent No.: US 11,362,048 B2
(45) Date of Patent: Jun. 14, 2022

(54) RADIOFREQUENCY DEVICE AND MANUFACTURING METHOD THEREOF

(71) Applicant: UNITED MICROELECTRONICS CORP., Hsin-Chu (TW)

(72) Inventors: Purakh Raj Verma, Singapore (SG); Wen-Shen Li, Singapore (SG); Ching-Yang Wen, Pingtung County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 364 days.

(21) Appl. No.: 16/145,128

(22) Filed: Sep. 27, 2018

(65) Prior Publication Data

US 2020/0075514 A1 Mar. 5, 2020

(30) Foreign Application Priority Data

Sep. 3, 2018 (CN) .......................... 201811018470.5

(51) Int. Cl.
*H01L 23/48* (2006.01)
*H01L 23/52* (2006.01)
(Continued)

(52) U.S. Cl.
CPC ............ *H01L 23/66* (2013.01); *H01L 21/565* (2013.01); *H01L 21/76243* (2013.01);
(Continued)

(58) Field of Classification Search
CPC .................. H01L 23/66; H01L 21/565; H01L 21/76243; H01L 21/76898; H01L 23/481;
(Continued)

(56) References Cited

U.S. PATENT DOCUMENTS 7,253,091 B2 * 8/2007 Brewer ............... H01L 21/8221
438/618
8,441,136 B2 5/2013 Chiou
(Continued)

FOREIGN PATENT DOCUMENTS

CN 105428323 A 3/2016
CN 106504985 A 3/2017

*Primary Examiner* — Didarul A Mazumder
(74) *Attorney, Agent, or Firm* — Winston Hsu

(57) ABSTRACT

A radiofrequency device includes a buried insulation layer, a transistor, a contact structure, a connection bump, an interlayer dielectric layer, and a mold compound layer. The buried insulation layer has a first side and a second side opposite to the first side in a thickness direction of the buried insulation layer. The transistor is disposed on the first side of the buried insulation layer. The contact structure penetrates the buried insulation layer and is electrically connected with the transistor. The connection bump is disposed on the second side of the buried insulation layer and electrically connected with the contact structure. The interlayer dielectric layer is disposed on the first side of the buried insulation layer and covers the transistor. The mold compound layer is disposed on the interlayer dielectric layer. The mold compound layer may be used to improve operation performance and reduce manufacturing cost of the radiofrequency device.

6 Claims, 9 Drawing Sheets

(51) Int. Cl.
  *H01L 23/66* (2006.01)
  *H01L 21/762* (2006.01)
  *H01L 21/56* (2006.01)
  *H01L 23/00* (2006.01)
  *H01L 23/522* (2006.01)
  *H01L 21/768* (2006.01)
  *H01L 23/528* (2006.01)

(52) U.S. Cl.
  CPC ...... *H01L 21/76898* (2013.01); *H01L 23/481* (2013.01); *H01L 23/528* (2013.01); *H01L 23/5226* (2013.01); *H01L 24/11* (2013.01); *H01L 24/13* (2013.01); *H01L 2223/6616* (2013.01)

(58) Field of Classification Search
  CPC ... H01L 23/5226; H01L 23/528; H01L 24/11; H01L 24/13; H01L 2223/6616
  See application file for complete search history.

(56) References Cited

U.S. PATENT DOCUMENTS

| | | | |
|---|---|---|---|
| 8,507,358 B2 | 8/2013 | Chou | |
| 9,455,187 B1* | 9/2016 | Gambino | H01L 27/1203 |
| 9,583,414 B2* | 2/2017 | Costa | H01L 23/3737 |
| 9,812,350 B2 | 11/2017 | Costa | |
| 10,085,352 B2* | 9/2018 | Costa | H01L 25/0655 |
| 10,466,442 B2* | 11/2019 | Chen | G02B 13/18 |
| 10,804,228 B2* | 10/2020 | Chen | H01L 29/7833 |
| 2008/0017968 A1* | 1/2008 | Choi | H01L 25/105 257/686 |
| 2014/0252566 A1* | 9/2014 | Kerr | H01L 21/0237 257/635 |
| 2014/0252567 A1* | 9/2014 | Carroll | H01L 21/0237 257/635 |
| 2015/0061020 A1 | 3/2015 | Yokoyama | |
| 2015/0235990 A1* | 8/2015 | Cheng | H01L 25/105 257/712 |
| 2015/0255368 A1* | 9/2015 | Costa | H01L 21/76251 257/506 |
| 2017/0117358 A1* | 4/2017 | Kim | H01L 21/762 |
| 2017/0141130 A1* | 5/2017 | Yamazaki | H01L 29/7869 |
| 2017/0345778 A1* | 11/2017 | Gremillet | H01L 23/053 |
| 2018/0012850 A1* | 1/2018 | Cheng | H01L 27/1211 |
| 2018/0174948 A1* | 6/2018 | Butt | H01L 21/6835 |
| 2020/0091346 A1* | 3/2020 | Yamazaki | H01L 23/544 |
| 2020/0411565 A1* | 12/2020 | Yamazaki | H01L 21/02178 |

* cited by examiner

RADIOFREQUENCY DEVICE AND MANUFACTURING METHOD THEREOF

BACKGROUND OF THE INVENTION

1. Field of the Invention

The present invention relates to a radiofrequency device and a manufacturing method thereof, and more particularly, to a radiofrequency device including a mold compound layer and a manufacturing method thereof.

2. Description of the Prior Art

In the semiconductor manufacturing related field, the size of functional devices in the integrated circuits becomes smaller continuously for enhancing the performance of the chip. However, as the density of the functional devices increased, the influence of many electrical properties on the device operation performance becomes more obvious, and that will hinder the development of scaling down and generate problems in manufacturing processes. For example, in some processes for forming a radiofrequency switch device, a semi-finished product formed by a part of the processes sometimes has to be moved to a handling substrate for performing subsequent processes. For reducing the influence of the handling substrate on the radiofrequency switch device, the electrical resistance of the handling substrate has to be high enough generally, and the manufacturing cost cannot be reduced accordingly because the handing substrate with high resistivity is more expensive. Additionally, in another process for forming a radiofrequency switch device, a silicon-on-insulator (SOI) substrate including a trap rich layer may be applied in the process, and this substrate is expensive too. In this kind of process, deterioration in a high-temperature process tends to happen, and it will be difficult to control problems such as signal loss and signal distortion of the radiofrequency switch device.

SUMMARY OF THE INVENTION

A radiofrequency device and a manufacturing method thereof are provided in the present invention. A mold compound layer is disposed on an interlayer dielectric layer, and the mold compound layer is used to replace a handling substrate required in the processes for improving the operation performance of the radiofrequency device and reducing the manufacturing cost of the radiofrequency device.

According to an embodiment of the present invention, a radiofrequency device is provided. The radiofrequency device includes a buried insulation layer, a transistor, a contact structure, a connection bump, an interlayer dielectric layer, and a mold compound layer. The buried insulation layer has a first side and a second side opposite to the first side in a thickness direction of the buried insulation layer. The transistor is disposed on the first side of the buried insulation layer. The contact structure penetrates the buried insulation layer and is electrically connected with the transistor. The connection bump is disposed on the second side of the buried insulation layer and is electrically connected with the contact structure. The interlayer dielectric layer is disposed on the first side of the buried insulation layer and covers the transistor. The mold compound layer is disposed on the interlayer dielectric layer.

According to an embodiment of the present invention, a manufacturing method of a radiofrequency device is provided. The manufacturing method includes the following steps. Firstly, a transistor is formed on a first side of a buried insulation layer. An interlayer dielectric layer is formed on the first side of the buried insulation layer, and the interlayer dielectric layer covers the transistor. A mold compound layer is formed on the interlayer dielectric layer. After forming the mold compound layer, a contact structure is formed penetrating the buried insulation layer and electrically connected with the transistor. A connection bump is formed on a second side of the buried insulation layer. The connection bump is electrically connected with the contact structure, and the second side is opposite to the first side in a thickness direction of the buried insulation layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-6 are schematic drawings illustrating a manufacturing method of the radiofrequency device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

DETAILED DESCRIPTION

In the following description, numerous embodiments are set forth in order to disclose specific features of the present invention, but not limited thereto. For one of ordinary skill in the related art, it should be understood that when an element such as a region, a layer, or a portion is referred to as being "formed" on another element, it can be directly, formed on the given element, or intervening elements may be present. However, when an element is described to be directly formed on another element, there is not any intervening element. Additionally, when an element is referred to as being "formed" on another element, the element may be formed on the given element by growth, deposition, etch, attach, connect, couple, or other approaches.

Additionally, terms, such as "bottom", "below", "above", "top", and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented and the spatially relative descriptors used herein interpreted accordingly.

Figure 1:
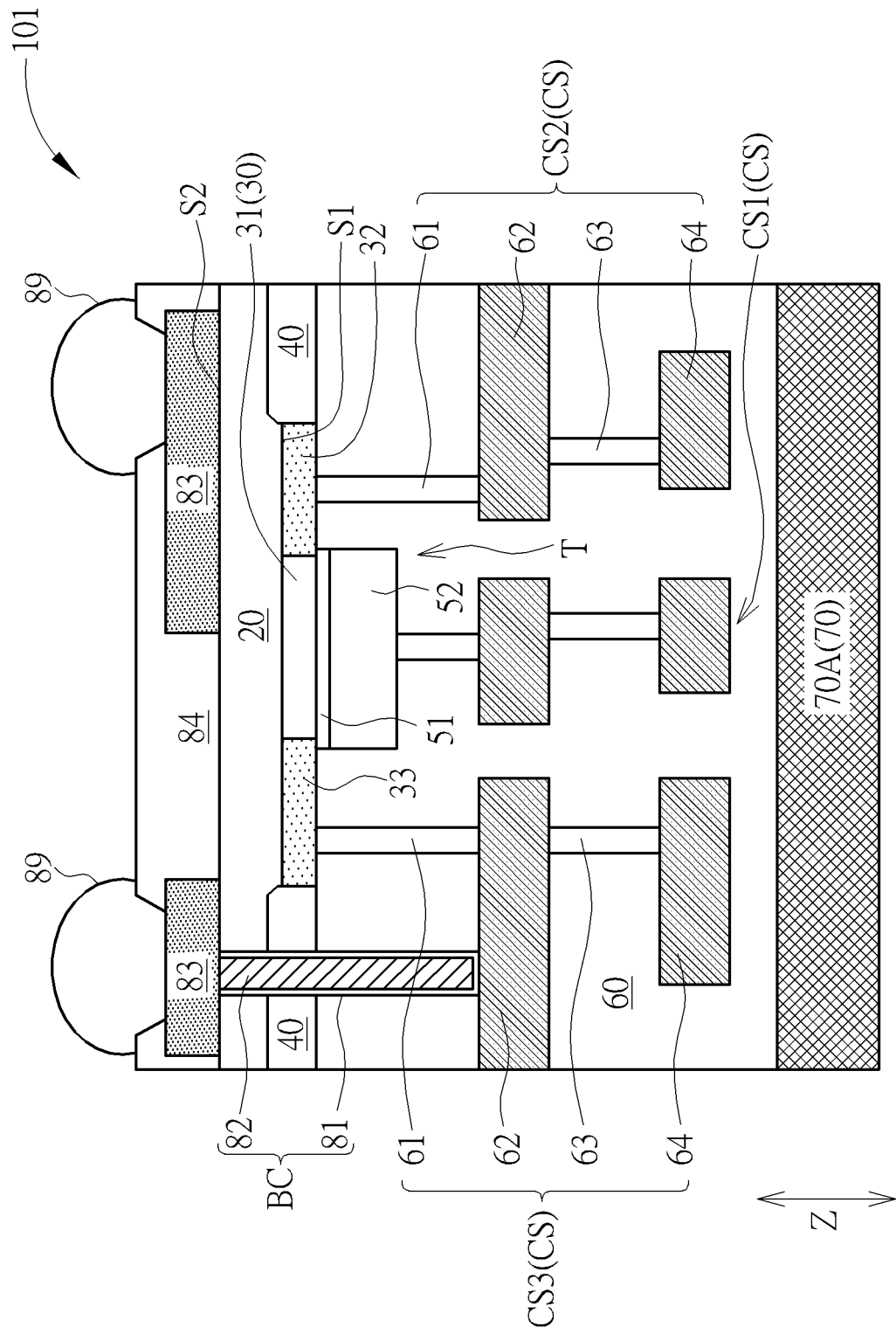
FIG. 1 is a schematic drawing illustrating a radiofrequency device according to a first embodiment of the present invention.

Please refer to FIG. 1. FIG. 1 is a schematic drawing illustrating a radiofrequency device according to a first embodiment of the present invention. As shown in FIG. 1, a radiofrequency device 101 is provided in the present invention. The radiofrequency device 101 includes a buried insulation layer 20, a transistor T, a contact structure BC, a connection bump 89, an interlayer dielectric layer 60, and a mold compound layer 70A. The buried insulation layer 20 has a first side S1 and a second side S2 opposite to the first side S1 in a thickness direction Z of the buried insulation layer 20. The transistor T is disposed on the first side S1 of the buried insulation layer 20. The contact structure BC penetrates the buried insulation layer 20 and is electrically connected with the transistor T. The connection bump 89 is disposed on the second side S2 of the buried insulation layer 20 and is electrically connected with the contact structure BC. The interlayer dielectric layer 60 is disposed on the first side S1 of the buried insulation layer 20 and covers the transistor T. The mold compound layer 70A is disposed on the interlayer dielectric layer 60. In some embodiments, the mold compound layer 70A is disposed on the first side S1 of the buried insulation layer 20, and the interlayer dielectric layer 60 is disposed between the buried insulation layer 20 and the mold compound layer 70A in the thickness direction Z of the buried insulation layer 20, but not limited thereto.

In some embodiments, the mold compound layer 70A may include a polymer-based material, a resin-based material, an epoxy material, benzocyclobutene (BCB), polyimide (PI), silicon oxide, or other suitable insulation materials having high electrical resistivity and/or low dielectric constant. For example, the electrical resistivity of the mold compound layer 70A may be greater than 20,000 ohm-cm for improving the operation performance, such as harmonic performance, of the radiofrequency device 101, but not limited thereto. In some embodiments, the mold compound layer 70A may include a curable material 70 coated on the interlayer dielectric layer 60, and the curable material 70 may include the insulation materials described above and required additives and/or other suitable insulation materials. The curing approach of the curable material 70 may include photo curing, thermal curing, or other suitable curing approaches, and the method for coating the curable material 70 may include spin coating, spray coating, slit coating, or other suitable coating approaches, but not limited thereto. In some embodiments, the mold compound layer 70A may also be formed on the interlayer dielectric layer 60 by other suitable methods and/or other suitable materials.

In some embodiments, the radiofrequency device 101 may further include an interconnection structure CS disposed in the interlayer dielectric layer 60 and electrically connected with the transistor T. For example, in some embodiments, the transistor T may include a semiconductor layer 30, a source doped region 32, a drain doped region 33, a gate dielectric layer 51, and a gate structure 52. The interconnection structure CS may include a first interconnection structure CS1, a second interconnection structure CS2, and a third interconnection structure CS3 electrically connected with the gate structure 52, the source doped region 32, and the drain doped region 33 respectively, but not limited thereto. In some embodiments, the buried insulation layer 20 and the semiconductor layer 30 may be an insulation layer and a semiconductor layer in a silicon-on-insulator (SOI) substrate respectively, the buried insulation layer 20 may include a buried oxide insulation layer, and the semiconductor layer may include a silicon-containing semiconductor material accordingly, but not limited thereto. In some embodiments, the buried insulation layer 20 may be formed by other insulation materials and/or the semiconductor layer 30 may be formed by other semiconductor materials according to other considerations. In addition, the interlayer dielectric layer 60 may include multiple layers of dielectric material, such as silicon oxide, silicon oxynitride, or other suitable dielectric materials.

When the buried insulation layer 20 and the semiconductor layer 30 are the insulation layer and the semiconductor layer in the SOI substrate respectively, the first side S1 of the buried insulation layer 20 may be regarded as a front side, and the second side S2 of the buried insulation layer 20 may be regarded as a back side, but not limited thereto. The transistor T is disposed on the first side S1 of the buried insulation layer 20, the gate dielectric layer 51 may be disposed between the gate structure 52 and the semiconductor layer 30, and the semiconductor layer 30 may be disposed between the gate dielectric layer 51 and the buried insulation layer 20, but not limited thereto. In some embodiments, the transistor T may also have a structure different from the structure described above and/or the allocation of the parts in the transistor T may be different from the condition described above according to some considerations. In some embodiments, the gate structure 52 may include a non-metal gate such as a polysilicon gate, a non-metal gate formed by other suitable conductive materials, or a metal gate. The gate dielectric layer 51 may include an oxide layer such as a silicon oxide layer or other suitable dielectric materials such as a high dielectric constant (high-k) dielectric material. In addition, the semiconductor layer 30 may include a body region 31 disposed between the gate structure 52 and the buried insulation layer 20 in the thickness direction Z of the buried insulation layer 20, and the body region 31 may include a channel region of the transistor T, but not limited thereto. The source doped region 32 and the drain doped region 33 may be disposed in the semiconductor layer 30 at two opposite sides of the gate structure 52 respectively. In some embodiments, the source doped region 32 and the drain doped region 33 may be doped regions including N type dopants such as phosphorus and arsenic, and the body region 31 may include a well such as a P well, but not limited thereto. In some embodiments, the source doped region 32 and the drain doped region 33 may also be formed by other kinds of N type dopants or dopants with other conductivity types.

In some embodiments, the first interconnection structure CS1, the second interconnection structure CS2, and the third interconnection structure CS3 may respectively include a plurality of plugs (such as a first plug 61 and a second plug 63 shown in FIG. 1) and a plurality of conductive layers (such as a first metal layer 62 and a second metal layer 64 shown in FIG. 1) alternately disposed and stacked, but not limited thereto. The first plug 61, the second plug 63, the first metal layer 62, and the second metal layer 64 may include a low resistivity material and a barrier layer respectively, but not limited thereto. The low resistivity material mentioned above may include materials having relatively lower resistivity, such as copper, aluminum, and tungsten, and the barrier layer mentioned above may include titanium nitride, tantalum nitride, or other suitable barrier materials, but not limited thereto. In some embodiments, the radiofrequency device 101 may further include an isolation structure 40 disposed on the first side S1 of the buried insulation layer 20 and surrounding a part of the transistor T. For example, the isolation structure 40 may be disposed on the buried insulation layer 20 and surround the semiconductor layer 30, and the isolation structure 40 may include a single layer or multiple layers of insulation materials such as an oxide insulation material or an oxynitride insulation material, but not limited thereto.

In some embodiments, the contact structure BC may be electrically connected with the transistor T via the interconnection structure CS. For instance, the contact structure BC may penetrates the buried insulation layer 20, the isolation structure 40, and a part of the interlayer dielectric layer 60 for contacting the first metal layer 62 in the third interconnection structure CS3 and forming the electrical connection. Therefore, the contact structure BC may be electrically connected with the drain doped region 33 in the transistor T via the third interconnection structure CS3 in the interconnection structure CS, but not limited thereto. The contact structure BC may penetrate the buried insulation layer 20 from the back side (i.e. the second side S2) to the front side (i.e. the first side S1) of the buried insulation layer 20 for being electrically connected with the transistor T, and the contact structure BC may be regarded as aback side contact structure, but not limited thereto. The contact structure may be formed by a barrier layer 81 and a conductive material 82. The barrier layer 81 may include titanium nitride, tantalum nitride, or other suitable barrier materials, and the conductive material 82 may include conductive materials having relatively lower electrical resistivity, such as copper, aluminum, and tungsten, but not limited thereto.

In some embodiments, the radiofrequency device 101 may further include a conductive layer (such as a first conductive layer 83 shown in FIG. 1) and a dielectric layer (such as a first dielectric layer 84 shown in FIG. 1) disposed on the second side S2 of the buried insulation layer 20. The first conductive layer 83 may contact and be electrically connected with the contact structure BC. The first dielectric layer 84 may be disposed on the buried insulation layer 20 and the first conductive layer 83, and a part of the first conductive layer 83 is exposed and is not covered by the first dielectric layer 84. The connection bump 89 may contact the exposed first conductive layer 83 for forming an electrical connection. Therefore, the connection bump 89 may be electrically connected with the contact structure BC via the first conductive layer 83. In some embodiments, the connection bump 89 may be electrically connected with the transistor T via the first conductive layer 83, the contact structure BC, and the interconnection structure CS, but not limited thereto. It is worth noting that, in some embodiments, a back side interconnection structure composed of a plurality of metal layers and a plurality of plugs alternately disposed and stacked may be formed on the second side S2 of the buried insulation layer 20 according to some considerations, and the connection bump 89 may be disposed on and electrically connected with this back side interconnection structure. In addition, the first dielectric layer 84 may include silicon nitride, silicon oxynitride, or other suitable insulation materials, and the first conductive layer 83 may include conductive materials having relatively lower electrical resistivity, such as copper, aluminum, and tungsten, but not limited thereto. The connection bump 89 may include a solder ball or other suitable types of connection bumps, and the material of the connection bump 89 may include gold, copper, tin, lead, or other suitable conductive materials.

In the radiofrequency device 101, the contact structure BC may penetrate the buried insulation layer 20 from the second side S2 of the buried insulation layer 20 away from the semiconductor layer 30 and be electrically connected with the transistor T. The interlayer dielectric layer 60 may be disposed on the first side S1 of the buried insulation layer 20 and cover the transistor T. The mold compound layer 70A disposed on the interlayer dielectric layer 60 may be used to replace a high resistance substrate used in a manufacturing process of the radiofrequency device 101 for reducing the manufacturing cost and improving the operation performance of the radiofrequency device 101.

Figure 2:
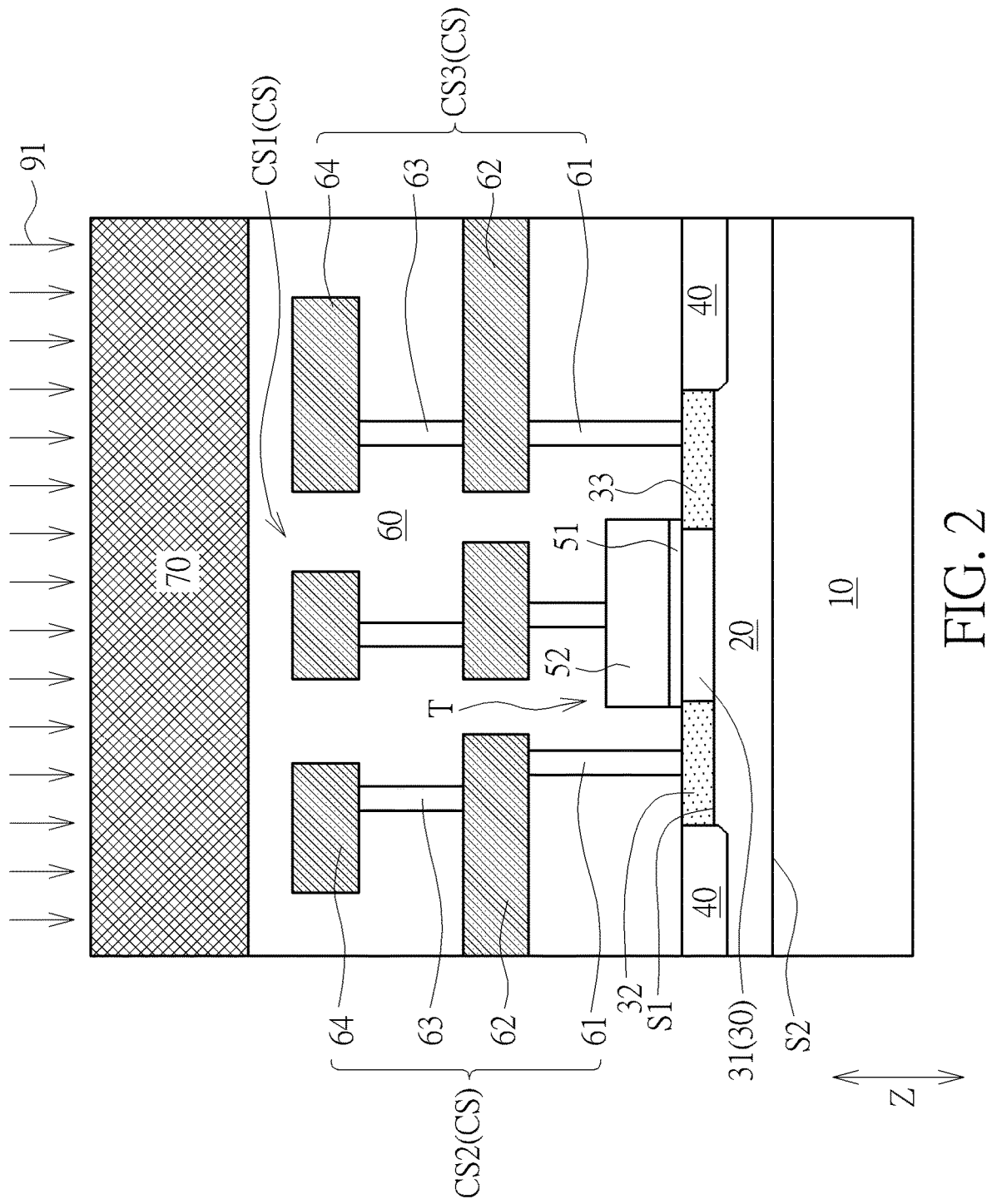
Figure 3:
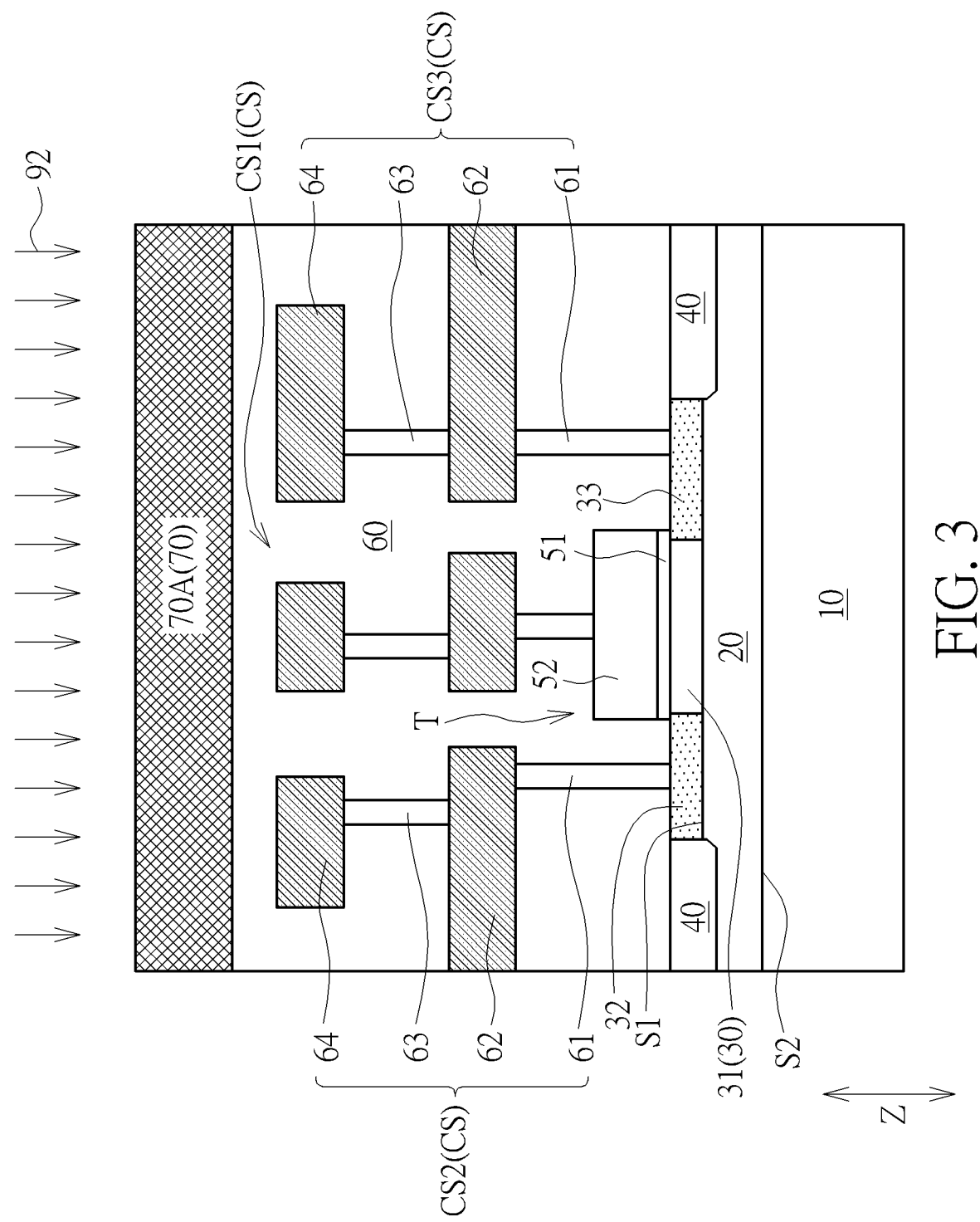
Figure 4:
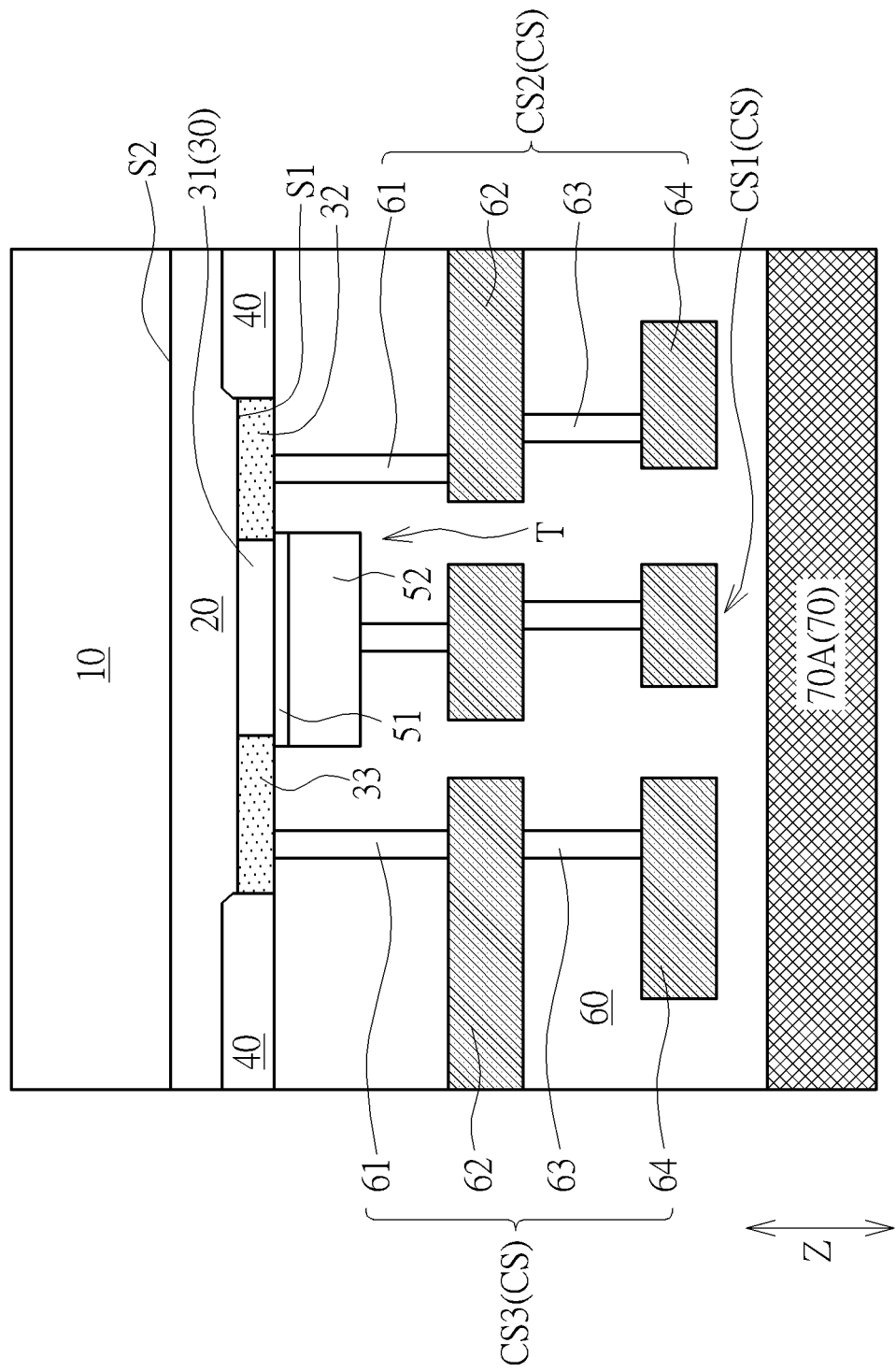
Figure 5:
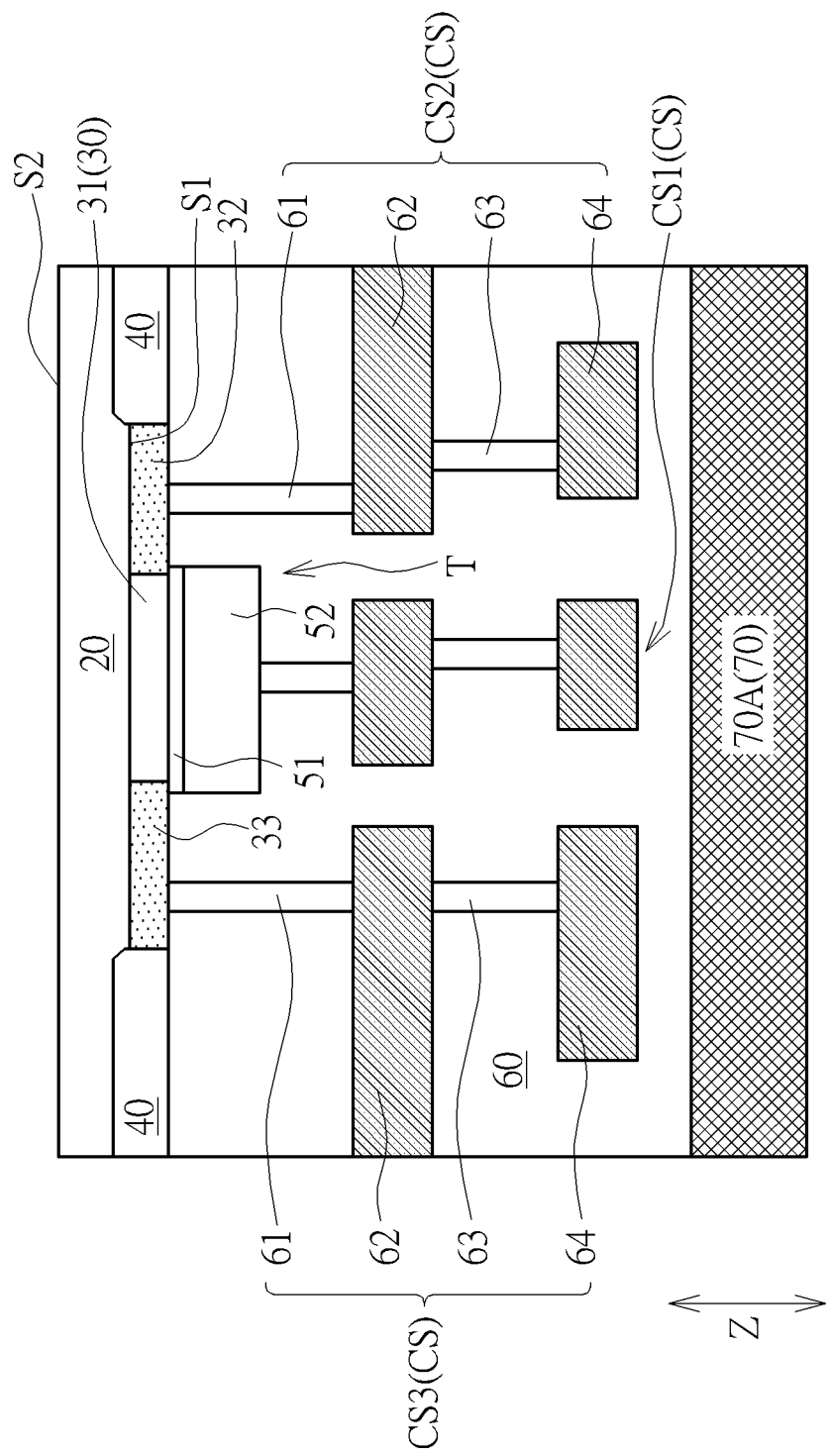
Figure 6:
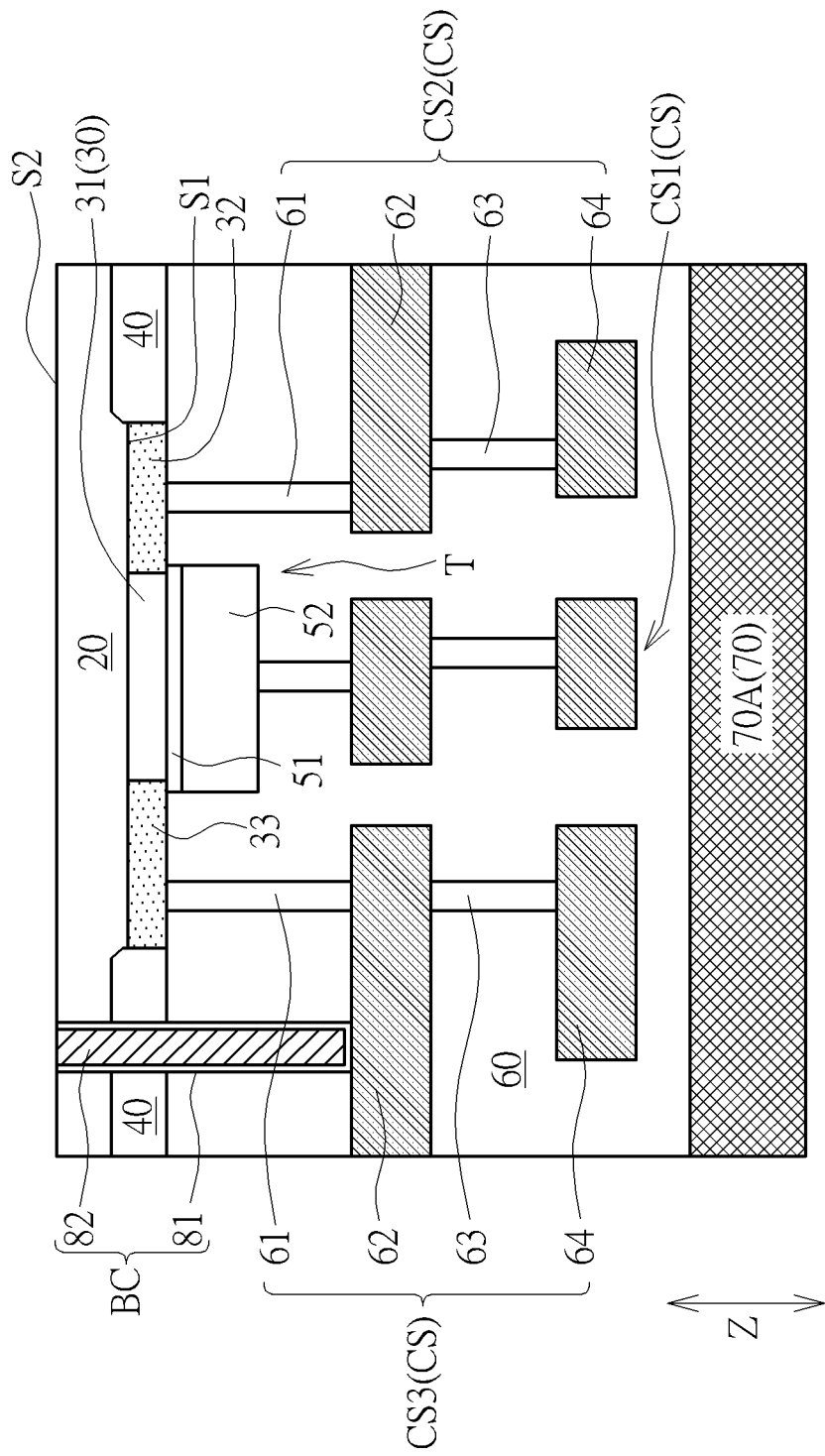

Please refer to FIGS. 2-6 and FIG. 1. FIGS. 2-6 are schematic drawings illustrating a manufacturing method of the radiofrequency device according to the first embodiment of the present invention. FIG. 3 is a schematic drawing in a step subsequent to FIG. 2. FIG. 4 is a schematic drawing in a step subsequent to FIG. 3. FIG. 5 is a schematic drawing in a step subsequent to FIG. 4. FIG. 6 is a schematic drawing in a step subsequent to FIG. 5. FIG. 1 may be regarded as a schematic drawing in a step subsequent to FIG. 6. As shown in FIG. 1, the manufacturing method of the radiofrequency device 101 in this embodiment may include the following steps. Firstly, the transistor T is formed on the first side S1 of the buried insulation layer 20. The interlayer dielectric layer 60 is formed on the first side S1 of the buried insulation layer 20, and the interlayer dielectric layer 60 covers the transistor T. The mold compound layer 70A is formed on the interlayer dielectric layer 60. After the step of forming the mold compound layer 70A, the contact structure BC is formed penetrating the buried insulation layer 20, and the contact structure BC is electrically connected with the transistor T. The connection bump 89 is formed on the second side S2 of the buried insulation layer 20, and the second side S2 is opposite to the first side S1 in the thickness direction Z of the buried insulation layer 20. The connection bump 89 is electrically connected with the contact structure BC.

Specifically, the manufacturing method of the radiofrequency device 101 in this embodiment may include but is not limited to the following steps. As shown in FIG. 2, the isolation structure 40 may be formed on the first side S1 of the buried insulation layer 20, and the isolation structure 40 may surround the semiconductor layer 30. Subsequently, the interlayer dielectric layer 60 and the interconnection structure CS may be formed after the step of forming the transistor T, and the interconnection structure CS may be formed in the interlayer dielectric layer 60. The first interconnection structure CS1 may be formed on and electrically connected with the gate structure 52. The second interconnection structure CS2 may be formed on and electrically connected with the source doped region 32. The third interconnection structure CS3 may be formed on and electrically connected with the drain doped region 33. In other words, the interlayer dielectric layer 60, the first interconnection structure CS1, the second interconnection structure CS2, the third interconnection structure CS3, and the transistor T including the semiconductor layer 30, the source doped region 32, the drain doped region 33, the gate dielectric layer 51, and the gate structure 52 may be all disposed over the first side S1 of the buried insulation layer 20. Additionally, a substrate 10 may be disposed on the second side S2 of the buried insulation layer 20. In some embodiments, the substrate 10, the buried insulation layer 20, and the semiconductor layer 30 may be regarded as an SOI substrate, and the substrate 10 may be a low electrical resistivity substrate, but not limited thereto.

Subsequently, as shown in FIG. 2 and FIG. 3, the mold compound layer 70A is formed on the interlayer dielectric layer 60 after the steps of forming the interlayer dielectric layer 60 and the interconnection structure CS. In some embodiments, the step of forming the mold compound layer 70A may include a coating process 91, and the mold compound layer 70A may include the curable material 70 coated on the interlayer dielectric layer 60 by the coating process 91, but not limited thereto. The coating process 91 may include spin coating, spray coating, slit coating, or other suitable coating approaches, and the mold compound layer 70A may include a polymer-based material, a resin-based material, an epoxy material, benzocyclobutene, polyimide, silicon oxide, or other suitable insulation materials having high electrical resistivity and/or low dielectric constant. The interconnection structure CS is not disposed in the mold compound layer 70A because the mold compound layer 70A is formed on the interlayer dielectric layer 60 after the step of forming the interconnection structure CS, and the material composition of the mold compound layer 70A is different from the material composition of the interlayer dielectric layer 60.

As shown in FIG. 3 and FIG. 4, after the steps of forming the mold compound layer 70A, the substrate 10 may be turned over, and the mold compound layer 70 originally located above the interlayer dielectric layer 60 may be located under the interlayer dielectric layer 60 after turning over the substrate 10. As shown in FIG. 4 and FIG. 5, the substrate 10 may then be removed for exposing the second side S2 of the buried insulation layer 20. Subsequently, as shown in FIG. 5 and FIG. 6, the contact structure BC described above may be formed. In some embodiments, the contact structure BC may penetrate the buried insulation layer 20, the isolation structure 40, and a part of the interlayer dielectric layer 60 for contacting and being electrically connected with the interconnection structure CS, and the contact structure BC may be electrically connected with the transistor T via the inter connection structure CS accordingly, but not limited thereto. In some embodiments, as shown in FIGS. 2-5, the substrate 10 may be located on the second side S2 of the buried oxide layer 20 during the step of forming the mold compound layer 70A, and the substrate 10 may be removed before the step of forming the contact structure BC. In some embodiments, a planarization process 92 may be performed to the mold compound layer 70A before the step of forming the contact structure BC and the step of removing the substrate 10 for improving the surface roughness of the mold compound layer 70A and/or adjusting the thickness of the mold compound layer 70A according to some considerations. In some embodiments, the mold compound layer 70A may be used to replace a high electrical resistivity handling substrate in processes subsequent to the step of removing the substrate 10 for reducing the manufacturing cost. Additionally, the electrical resistivity of the mold compound layer 70A may be greater than 20,000 ohm-cm for improving the operation performance, such as harmonic performance, of the radiofrequency device 101, but not limited thereto.

Figure 7:
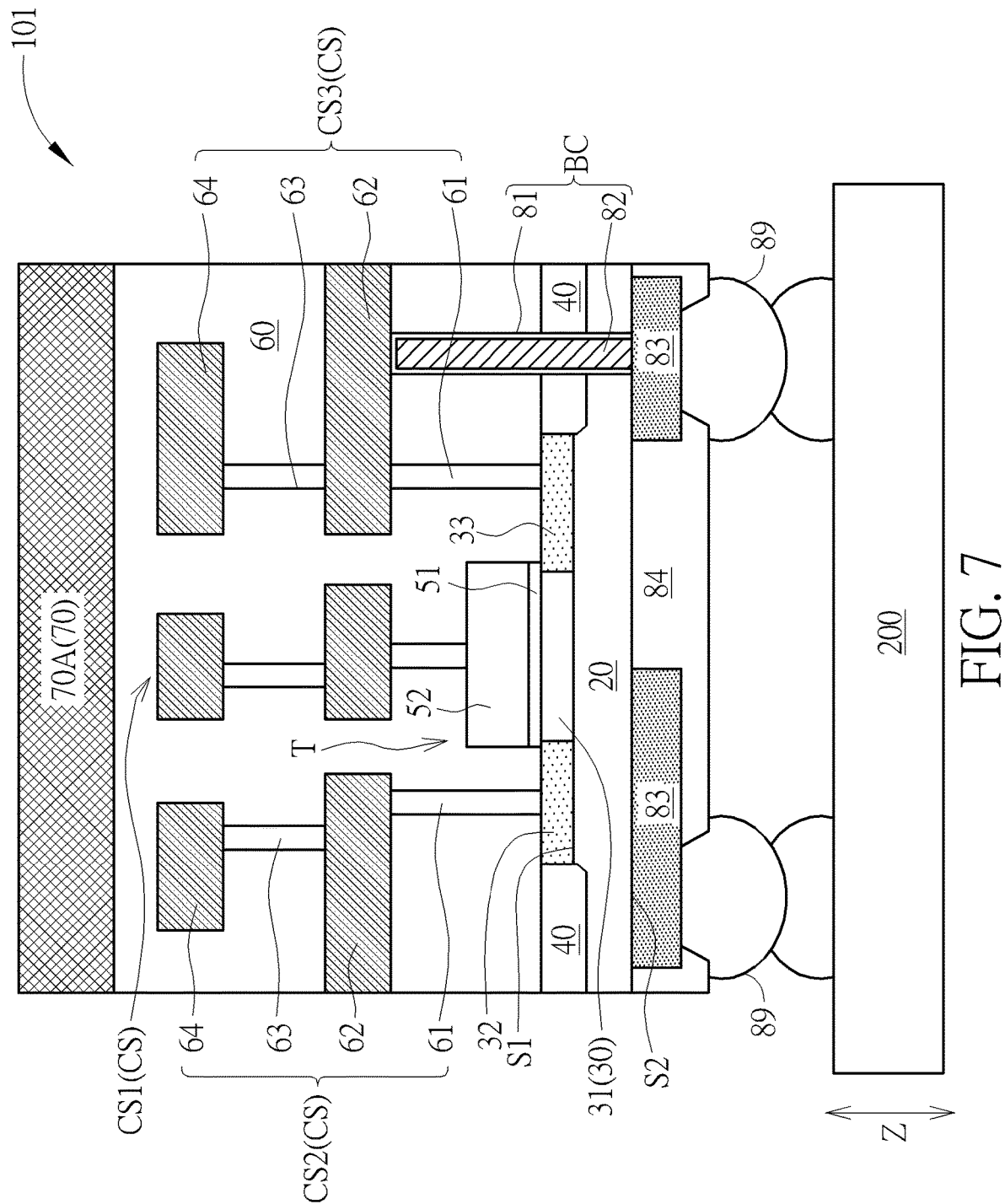
FIG. 7 is a schematic drawing illustrating the radiofrequency device bonded to a packaging substrate according to the first embodiment of the present invention.

As shown in FIG. 6 and FIG. 1, the first conductive layer 83, the first dielectric layer 84, and the connection bump 89 may then be formed on the second side S2 of the buried insulation layer 20 after the step of forming the contact structure BC. The connection bump 89 is formed on the first conductive layer 83, and the connection bump 89 is electrically connected with the contact structure BC via the first conductive layer 83. Additionally, please refer to FIG. 7. FIG. 7 is a schematic drawing illustrating the radiofrequency device 101 in this embodiment bonded to a packaging substrate 200. As shown in FIG. 7, in some embodiments, the radiofrequency device 101 may be bonded to and electrically connected with the packaging substrate 200 via the connection bump 89, and other integrated circuits and/or other functional devices may be disposed on the packaging substrate 200 according to other considerations. In other words, the mold compound layer 70A in this embodiment is formed on the interlayer dielectric layer 60 before the step of being bonded with the packaging substrate 200, and the mold compound layer 70A may directly contact the top surface of the interlayer dielectric layer 60 away from the buried insulation layer 20, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
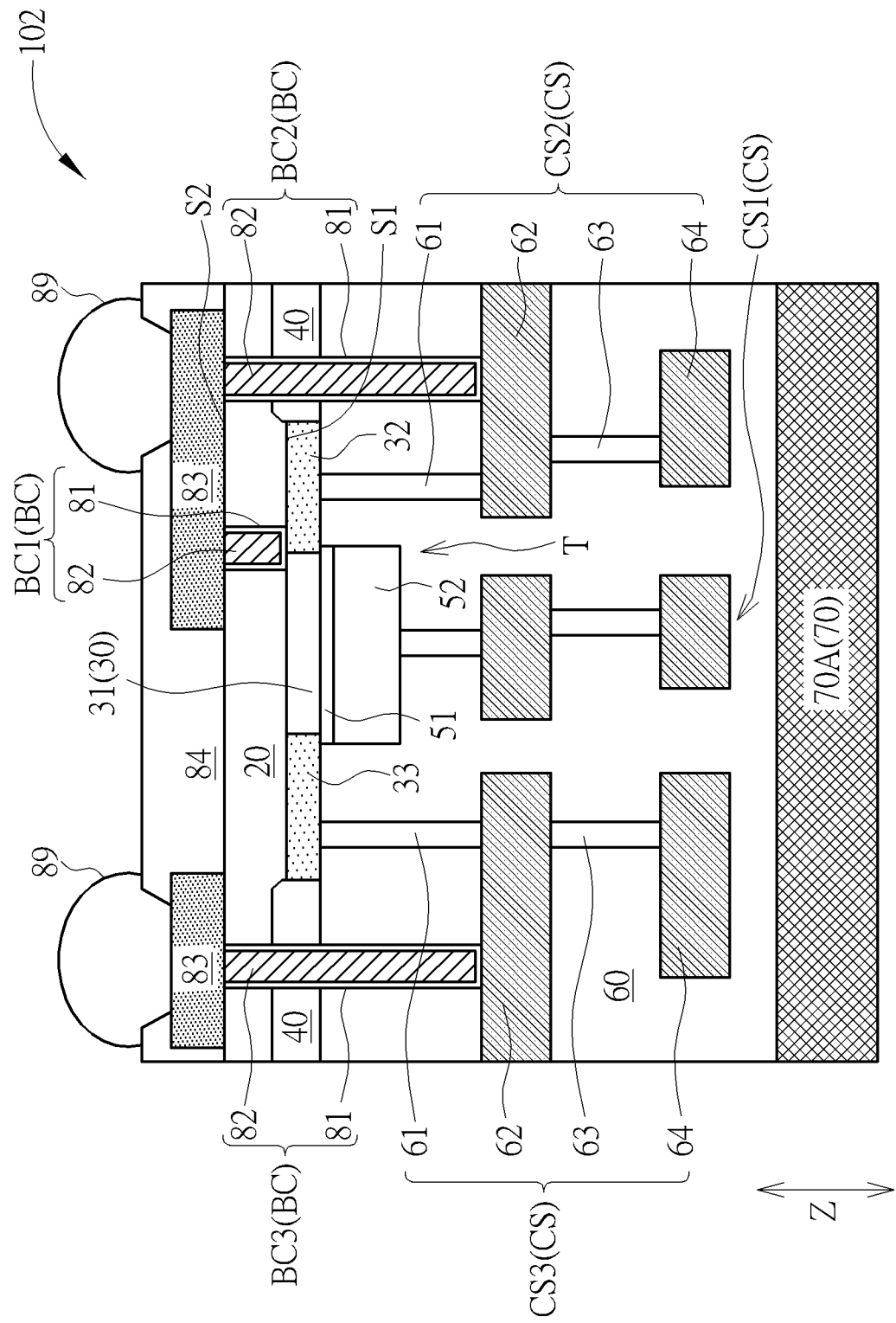
FIG. 8 is a schematic drawing illustrating a radiofrequency device according to a second embodiment of the present invention.

Please refer to FIG. 8. FIG. 8 is a schematic drawing illustrating a radiofrequency device 102 according to a second embodiment of the present invention. As shown in FIG. 8, the difference between the radiofrequency device 102 and the radiofrequency device in the first embodiment described above is that the contact structure BC in this embodiment may directly contact the transistor T. For example, the contact structure BC may include a first contact structure BC1, a second contact structure BC2, and a third contact structure BC3 electrically connected with the body region 31, the source doped region 32, and the drain doped region 33 of the transistor T respectively. In some embodiments, the second contact structure BC2 may penetrate the buried insulation layer 20, the isolation structure 40 and the interlayer dielectric layer 60 located between the isolation structure 40 and the first metal layer 62 from the second side S2 of the buried insulation layer 20 for contacting and being electrically connected with the first metal layer 62 of the second interconnection structure CS2. The third contact structure BC3 may penetrate the buried insulation layer 20, the isolation structure and the interlayer dielectric layer 60 located between the isolation structure 40 and the first metal layer 62 from the second side S2 of the buried insulation layer 20 for contacting and being electrically connected with the first metal layer 62 of the third interconnection structure CS3. Additionally, the first contact structure BC1 may penetrate the buried insulation layer 20 from the second side S2 of the buried insulation layer 20 for contacting the body region 31. In some embodiments, the body region 31 may be electrically connected with the source doped region 32 via the first contact structure BC1, the first conductive layer 83, the second contact structure BC2, and the second interconnection structure CS2, but not limited thereto. In some embodiments, the radiofrequency device 102 may be applied in a low noise amplifier (LNA), a power amplifier (PA), or other suitable radiofrequency applications, but not limited thereto.

Figure 9:
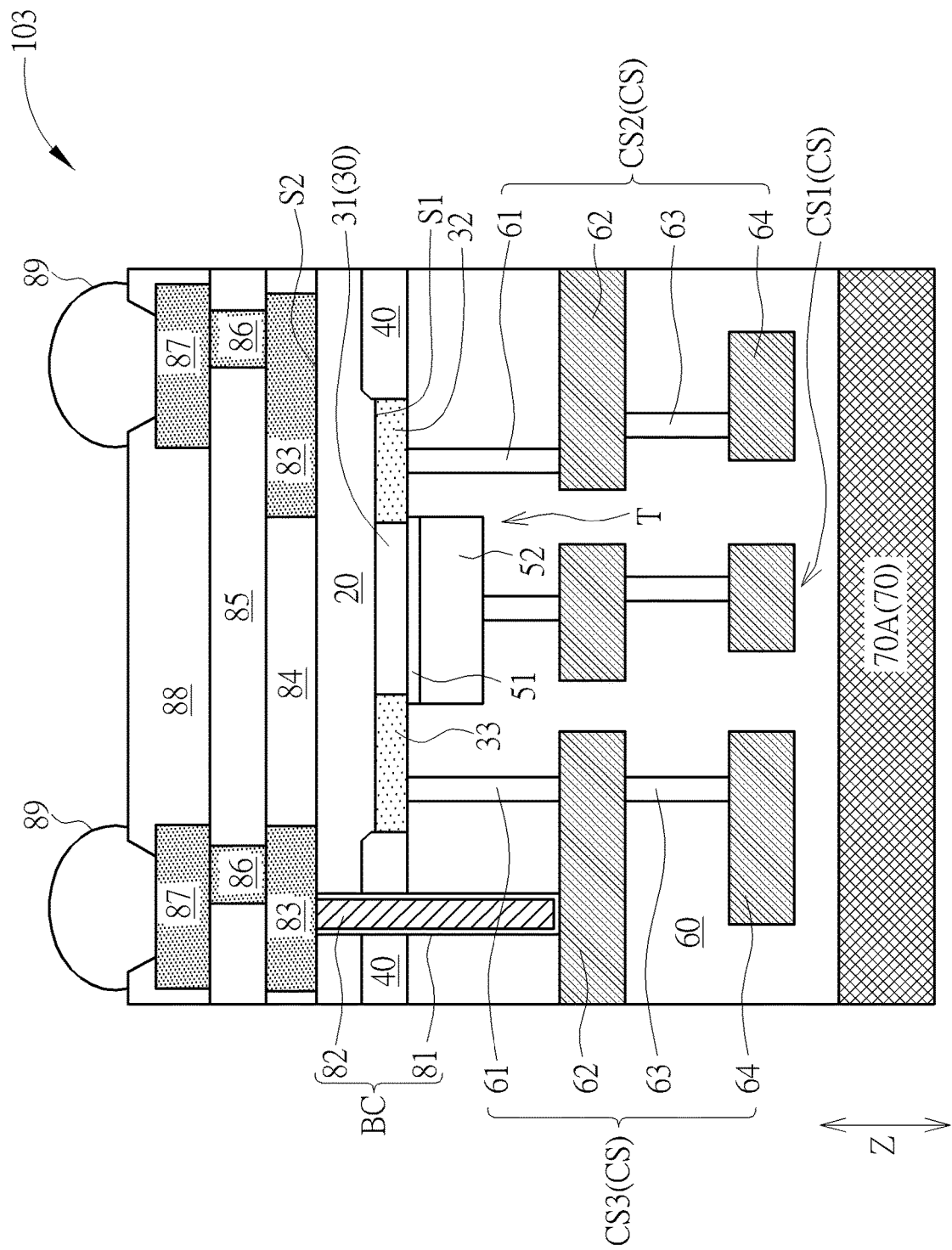
FIG. 9 is a schematic drawing illustrating a radiofrequency device according to a third embodiment of the present invention.

Please refer to FIG. 9. FIG. 9 is a schematic drawing illustrating a radiofrequency device 103 according to a third embodiment of the present invention. As shown in FIG. 9, the difference between the radiofrequency device 103 and the radiofrequency device in the first embodiment described above is that, in the radiofrequency device 103 of this embodiment, a back side interconnection structure composed of a plurality of metal layers and a plurality of plugs alternately disposed and stacked may be disposed on the second side S2 of the buried insulation layer 20 according to some considerations, and the connection bump 89 may be disposed on and electrically connected with this back side interconnection structure. For example, the radiofrequency device 103 may further include a second dielectric layer 85, a back side plug 86, a second conductive layer 87, and a third dielectric layer 88 disposed on the second side S2 of the buried insulation layer 20. The second dielectric layer 85 covers the first dielectric layer 84 and the first conductive layer 83. The back side plug 86 penetrate the second dielectric layer 85 for being connected with the first conductive layer 83. The second conductive layer 87 is disposed on the back side plug 86 and electrically connected with the back side plug 86. The third dielectric layer 88 is disposed on the second dielectric layer 85 and the second conductive layer 87 and exposes a part of the second conductive layer 87, and the connection bump 89 may contact and be electrically connected with the exposed second conductive layer 87. The material of the second dielectric layer 85 and the material of the third dielectric layer 88 may be similar to the material of the first dielectric layer 84 described above, and the material of the back side plug 86 and the material of the second conductive layer 87 may be similar to the material of the first conductive layer 83 described above, but not limited thereto.

To summarize the above descriptions, in the radiofrequency device and the manufacturing method thereof in the present invention, the mold compound layer may be formed on the interlayer dielectric layer after the steps of forming the interlayer dielectric layer and the interconnection structure, and the mold compound layer may be used to replace the expensive high resistance substrate in the manufacturing process for reducing the manufacturing cost of the radiofrequency device and improving the operation performance of the radiofrequency device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radiofrequency (RF) device, comprising:
   a buried insulation layer, wherein the buried insulation layer has a first side and a second side opposite to the first side in a thickness direction of the buried insulation layer;
   a transistor disposed on the first side of the buried insulation layer;
   a contact structure penetrating the buried insulation layer and electrically connected with the transistor;
   a connection bump disposed on the second side of the buried insulation layer and electrically connected with the contact structure;
   an interlayer dielectric layer disposed on the first side of the buried insulation layer and covering the transistor;
   a mold compound layer disposed on the interlayer dielectric layer;
   an interconnection structure disposed in the interlayer dielectric layer and electrically connected with the transistor, wherein the mold compound layer is physically and electrically separated from the interconnection structure by the interlayer dielectric layer, and the contact structure is electrically connected with the transistor via the interconnection structure; and
   an isolation structure disposed on the first side of the buried insulation layer and surrounding a part of the transistor, wherein the isolation structure is disposed between the buried insulation layer and the interlayer dielectric layer, and the contact structure further penetrates the isolation structure for being electrically connected with the interconnection structure.

2. The RF device according to claim 1, wherein the interlayer dielectric layer is disposed between the mold compound layer and the buried insulation layer.

3. The RF device according to claim 1, wherein the mold compound layer comprises a polymer-based material, a resin-based material, an epoxy material, or benzocyclobutene.

4. The RF device according to claim 1, wherein a resistivity of the mold compound layer is greater than 20,000 ohm-cm.

5. The RF device according to claim 1, wherein the mold compound layer comprises a curable material coated on the interlayer dielectric layer.

6. The RF device according to claim 1, further comprising:
   a conductive layer disposed on the second side of the buried insulation layer, wherein the connection bump is disposed on the conductive layer, and the connection bump is electrically connected with the contact structure via the conductive layer.

* * * * *